US009978643B2

(12) United States Patent
Kriebel et al.

(10) Patent No.: US 9,978,643 B2
(45) Date of Patent: May 22, 2018

(54) METHOD OF SEPARATING CHIPS FROM A WAFER

(71) Applicant: Smartrac Technology GmbH, Dresden (DE)

(72) Inventors: Frank Kriebel, Lichtenberg (DE); Laurence Singleton, Dresden (DE); Carsten Nieland, Gotha (DE)

(*) Notice: Subject to any disclaimer, the term of this patent is extended or adjusted under 35 U.S.C. 154(b) by 0 days. days.

(21) Appl. No.: 14/785,554

(22) PCT Filed: Apr. 24, 2014

(86) PCT No.: PCT/EP2014/058316
§ 371 (c)(1),
(2) Date: Oct. 19, 2015

(87) PCT Pub. No.: WO2014/173999
PCT Pub. Date: Oct. 30, 2014

(65) Prior Publication Data
US 2016/0093534 A1    Mar. 31, 2016

(30) Foreign Application Priority Data
Apr. 24, 2013  (DE) .................. 10 2013 207 480

(51) Int. Cl.
*H01L 21/78* (2006.01)
*B23K 26/53* (2014.01)
(Continued)

(52) U.S. Cl.
CPC .......... *H01L 21/78* (2013.01); *B23K 26/0006* (2013.01); *B23K 26/0057* (2013.01);
(Continued)

(58) Field of Classification Search
CPC ......... H01L 21/78–21/82; H01L 29/30–29/34; B23K 26/0057; B23K 2201/40; B23K 2203/56
See application file for complete search history.

(56) References Cited

U.S. PATENT DOCUMENTS

| 2007/0111478 | A1 | 5/2007 | Komura et al. |
| 2007/0111481 | A1 | 5/2007 | Tamura et al. |
| 2007/0202619 | A1* | 8/2007 | Tamura ............. B23K 26/0057 438/22 |

(Continued)

FOREIGN PATENT DOCUMENTS

| EP | 1 338 371 | 8/2003 |
| EP | 1 570 941 | 9/2005 |

(Continued)

OTHER PUBLICATIONS

PCT, Translation of the International Preliminary Report on Patentability, PCT/EP2014/058316, dated Nov. 5, 2015, 11 pages.
(Continued)

*Primary Examiner* — Stephen Bradley
(74) *Attorney, Agent, or Firm* — Tue Nguyen

(57) ABSTRACT

The invention relates to a method for producing chips (13) by dividing a wafer along dividing lines (11, 12) defining dimensions of the chip, wherein a focus (18) of a preferably pulsed laser radiation (16) is moved along the dividing lines on a first and at least a second path (25, 26) within the wafer body, wherein the laser radiation is applied to the wafer from a rear side (17) of the wafer, and the power density for producing the defects (28) on the first path (25) is lower than the power density for producing the defects (29) on the second path (26), and/or the number of defects on the first path is smaller than the number of defects on the second path.

12 Claims, 2 Drawing Sheets

(51) Int. Cl.
*B23K 26/00* (2014.01)
*B23K 26/40* (2014.01)
*H01L 29/34* (2006.01)
*B23K 101/40* (2006.01)
*B23K 103/16* (2006.01)
*B23K 103/00* (2006.01)

(52) U.S. Cl.
CPC .............. *B23K 26/40* (2013.01); *B23K 26/53* (2015.10); *H01L 29/34* (2013.01); *B23K 2201/40* (2013.01); *B23K 2203/172* (2015.10); *B23K 2203/50* (2015.10); *B23K 2203/56* (2015.10)

(56) References Cited

U.S. PATENT DOCUMENTS

| | | | |
|---|---|---|---|
| 2008/0000884 A1 | 1/2008 | Sugiura et al. | |
| 2011/0312193 A1* | 12/2011 | Abe | H01L 33/0095 438/795 |
| 2014/0203687 A1* | 7/2014 | Stegmeier | B06B 1/0629 310/334 |

FOREIGN PATENT DOCUMENTS

| | | |
|---|---|---|
| EP | 1 875 983 | 1/2008 |
| EP | 2 040 286 | 3/2009 |

OTHER PUBLICATIONS

International Search Report dated Aug. 12, 2014 for International Application No. PCT/EP2014/058316.

* cited by examiner

METHOD OF SEPARATING CHIPS FROM A WAFER

CROSS-REFERENCE TO RELATED APPLICATIONS

This application represents the national stage entry of PCT International Application No. PCT/EP2014/058316 filed Apr. 24, 2014 and claims priority to German Patent Application No. 10 2013 207 480.8 filed Apr. 24, 2013. The contents of this application are hereby incorporated by reference as if set forth in their entirety herein.

The invention relates to a method for separating chips from a wafer by dividing the wafer along dividing lines defining dimensions of the chip, wherein a focus of a pulsed laser radiation is moved along the dividing lines on a first and at least a second path within the wafer body, wherein the first path runs between a functional layer arranged on the front side of the wafer and the second path in such a manner that polycrystalline defects for generating internal stresses in the silicon body are formed on the paths as a result of a partial melting of the monocrystalline silicon body, and wherein following the production of a path system of first and second paths, the wafer is subjected to a mechanical load so as to separate the chips from the wafer by way of a material fracture in dividing planes which are defined by the first and second path and form the lateral surfaces of the chips. Furthermore, the invention relates to a chip comprising a semiconductor body of silicon and a functional layer which is formed on a front side of the semiconductor body and is spaced from a rear side of the semiconductor body by a semiconductor base, wherein the semiconductor body has lateral surfaces with surface areas which have a differing topography and which have at least two paths which run at a distance from the rear side on the lateral surfaces and are marked by defects of the surface of the semiconductor body, wherein the first path is arranged between the functional layer and the second path.

In the method of the kind mentioned in the introduction, which is also known under the professional term "stealth dicing", defects or weak points are produced within the wafer body in the crystalline structure of the wafer beneath the wafer surface, thus in a hidden manner, by means of laser application to the wafer, said defects causing the wafer to fracture along the paths within the wafer defined by the defects when the wafer is subsequently subjected to a mechanical load.

The defects are formed by a partial or discretely local melting of punctual areas in the silicon body, which causes the monocrystalline silicon in the melted areas to convert to polycrystalline silicon, which has a larger volume compared to monocrystalline silicon, so that corresponding compressive stresses are generated within the silicon body, which, when superposed with stresses that are induced within the wafer by an external load on the wafer, cause the wafer to fracture in the planes defined by the defects.

For clearly defining the afore-mentioned stress or dividing planes, it is known from EP 1 338 371 A1 to produce two paths which are arranged in a plane vertically to the surface of the wafer and which are defined by a linear arrangement of a plurality of defects within the silicon body. When the internal stresses of the silicon body generated in the stress plane by the defects are superposed with a stress induced by an external load, microscopic fractures, so-called Wallner lines, form in an area between the paths, said fractures causing the wafer body to fracture and the silicon wafer to be divided into the individual chips in case of a corresponding distribution or arrangement of the paths in the silicon body of the wafer.

Examinations of the chips produced according to the known method by separation from the wafer body have shown that, in fact, the micro cracks within the silicon body propagate not only in a plane area between the fault lines formed by the paths in the crystalline structure of the silicon body, but that the micro cracks rather also extend beyond the area delimited by the fault lines.

In particular in such cases where the cracks extend beyond the fault line which is oriented towards the active layer or functional layer of the semiconductor body, there is the risk that the micro cracks may extend as far as to become closely adjacent to the functional layer or that they may even reach the functional layer. Even if the functional layer of the semiconductor bodies of the chips produced by separation from the wafer is probably not affected following the production of the chips, i.e. the separation of the chips from the wafer body, there is always the risk in chips which have been produced according to the known methods that micro cracks which extend into the vicinity of the functional layer may propagate further and may lead to failure of the chip due to an external load on the chip or on the device during the handling of the chip or of the device provided with such a chip.

Owing to their intended use, chips which are subject to bending stresses either due to the manner of their application or due to the use of a device provided with the chip are especially at risk. This applies in particular to very thin chips, which are employed in tags, i.e. labels, or chip cards, for example, and which are even thinned further after having been separated from a wafer body in order to yield chips that are as thin as possible, i.e. which have a reduced semiconductor base and thus a correspondingly reduced stiffness.

It is the object of the present invention to propose a method for producing chips and chips which have a reduced likelihood of failure due to uncontrolled cracking as compared to the chips produced by the known methods.

To attain said object, the method according to the invention comprises the features of claim 1.

According to the invention, laser radiation is applied to the wafer from a rear side of the wafer. The power density for producing the defects on the first path is lower than the power density for producing the defects on the second path, and/or the number of defects on the first path is smaller than the number of defects on the second path, such that a falling stress gradient is formed between the internal stresses induced along the second path and the first path by the defects, and the first path forms a barrier preventing cracks from propagating beyond the first path in the direction of the functional layer of the wafer.

By applying to the focused points along the first path a power density that is relatively lower than the power density applied to the focused points of the second path, it becomes possible to adapt the effective energy input to the position of the paths within the wafer body and to the respective distance of the paths from the functional layer. This is based on the understanding that a lower energy input for producing the defects along the first path, i.e. the path arranged relatively closer to the functional layer, leads to the formation of smaller defects and to an induction of comparatively lower stresses within the silicon body. The comparatively higher internal stresses thus are induced along the second path, wherein studies have shown that when stress cracks form because of an external bending and/or tensile load on the wafer, this relative stress gradient from the second path to the first path leads to micro cracks forming starting from the second path and causes the first path to act as a barrier against crack propagation beyond the first path in the direction of the functional layer of the wafer.

It is to be noted that the method according to the invention and the chip according to the invention do not require a silicon body in all cases; instead, a crystalline structure, in particular a crystalline semiconductor structure, must be provided in principle. Thus, neither the term "silicon body" nor the term "semiconductor body of silicon" are to be understood as limiting, but rather as an example.

Additionally or alternatively to producing the defects on the first and second path with differentiated power densities, an induced stress which is higher relative to the first path can be achieved along the second path in that the number of defects on the first path is smaller than the number of defects on the second path. Even when the power densities are identical when producing the defects of the first path and of the second path, a comparatively higher stress on the second path can be achieved if the second path has a higher number of defects or a higher density, i.e. a smaller distance between adjacent defects.

Preferably, the difference between the power density for producing the defects on the first path and the power density for producing the defects on the second path is selected such that the lateral surfaces of the chips exhibit a lower roughness in a surface area between the first path and the front side of the chips than in a surface area between the first path and the second path.

Preferably, the difference between the number of defects on the first path and the number of defects on the second path is selected such that the lateral surfaces of the chips exhibit a lower roughness in a surface area between the first path and the front side of the chips than in a surface area between the first path and the second path.

It proves particularly advantageous if the production of the first path takes place prior to the production of the second path because in combination with the rearward application of laser energy to the wafer it can be precluded in this manner that the paths influence each other, i.e. that the position of a defect on the second path would prevent the coinciding positioning of a defect on the first path, for example.

If, according to a preferred embodiment of the method, the second path is produced adjacent to or in a center plane of the wafer, the stress induced in the area of the second path is substantially independent of an external bending load on the wafer.

Depending on the total thickness or height of the wafer body and on the degree of doping, different amounts of the power density for producing the defects of the first path in relation to the power density for producing the defects of the second path have proven advantageous. With a wafer thickness of about 120 µm, it is particularly advantageous if the power density for producing the defects of the first path is at maximum 75% of the power density for producing the defects of the second path. A power density of 80 or 90% of the power density for producing the defects of the second path can thus prove advantageous in more thinly formed wafer bodies.

It has turned out to be particularly advantageous if a third path is produced between the center plane and the rear side of the wafer so that a gradient of the stresses induced along the paths, which will be mentioned by way of example in the following advantageous embodiments, can be adjusted within the silicon body between the third path and the second path. By producing a third path, in particular, the power densities for the paths can be selected such that a falling gradient occurs both from the second path to the first path and from the second path to the third path.

Also in case a third path is produced, different relative power densities for producing the defects of the third path have proven advantageous so that the power density for producing the defects of the third path in a wafer body with a thickness of about 120 µm, for example, is particularly advantageously selected to be 30% of the power density for producing the defects of the second path.

In other advantageous embodiments, the relative power density is 40 or 50% of the power density for producing the defects of the second path.

To attain the initially mentioned object, the chip according to the invention has the features of claim 13.

According to the invention, the semiconductor body of the chip has lateral surfaces which have a first surface area between a first and a second path. The first path forms a barrier which separates the first surface area from a second surface area formed between the functional layer and the barrier, wherein the second surface area has a lower surface roughness than the first surface area, and the first surface area shows micro cracks.

Thus, as is readily visible on the outside from the topography of the lateral surfaces, the chip according to the invention has a surface area between the first and the second path which has a relatively high surface roughness resulting from the formation of the micro cracks during the separation of the chips from the wafer body. In contrast to this surface area, the surface area which is separated by the first path and is oriented toward the functional layer has a comparatively low roughness so that a comparatively low stress concentration occurs within this surface area in response to an external load on the chip. Thus, compared to a chip which also has a relatively high roughness in the surface area between the first path and the functional layer, the chip according to the invention presents less likelihood that further micro cracks, which may even extend into the functional layer, will form starting from the surface area oriented towards the functional layer in reaction to an external bending load on the chip.

If, according to a preferred embodiment, the number of defects on the first path is smaller than the number of defects on the second path, the risk of micro cracks forming in the surface area of the lateral surfaces oriented toward the functional layer is reduced further.

In particular if the surface area with increased roughness has micro cracks, which are also often called "Wallner lines", wherein the micro cracks extend as far as to the first path, it is readily visible from the outside due to the micro cracks limited in length by the first path that the respective chip has a comparatively low likelihood of failure due to mechanical loads.

Advantageously, the arrangement of the paths is selected such that in case of external loads on the wafer, the formation of cracks for separation of the chips starts specifically in the area between the first and the second path and connects said paths.

It proves particularly advantageous with respect to a high mechanical resilience and, as a result, a low likelihood of failure if the second path runs adjacent to or on a center line of the lateral surface.

A chip with high mechanical resilience and a resulting correspondingly low likelihood of failure of the chip becomes possible if the second path runs in a surface area of the lateral surface which is delimited by the center line and the rear side of the semiconductor body, and the second path runs at a distance m from the center line, said distance corresponding to 30% of the height h of the semiconductor body.

Tests have shown that the mechanical resilience of the chip can be positively influenced in that the first path runs at a defined distance from the front side of the semiconductor body, in particular as a function of the height h of the semiconductor body. In a semiconductor body of about 120 µm thickness, it has proven advantageous if said distance is larger than 30% of the distance h/2 between the front side and the center line of the lateral surface.

With increasing reduction of the thickness or height of the semiconductor body, a correspondingly increasing distance of the first path from the front side of the semiconductor body, i.e. about 40 or 50% of the distance h/2 between the front side and the center line of the lateral surface, has proven advantageous.

In any case, it has proven advantageous if the third path runs at a distance c from the rear side of the semiconductor body, said distance being larger than 10% of the height of the semiconductor body.

In the following, an option for implementing the method according to the invention and embodiments of chips producible with said method will be illustrated in more detail with the aid of the drawing.

Figure 1:
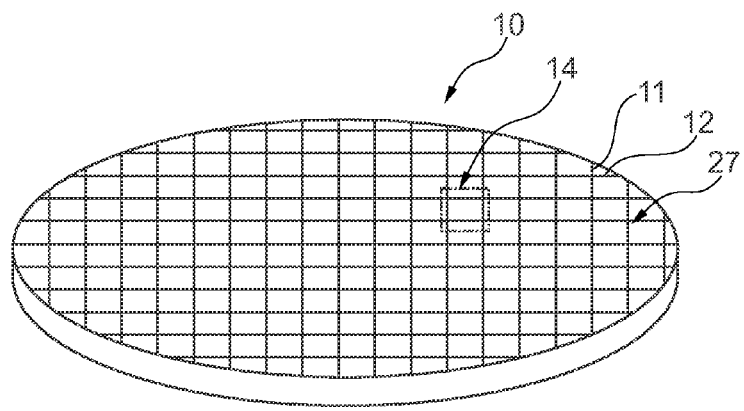
FIG. 1 shows a wafer which is intended to be separated into a plurality of individual chips as indicated by the dividing lines.

FIG. 1 shows a wafer 10 which is provided with orthogonal dividing lines 11, 12 of a dividing pattern 27 on the surface of its front side 19, said dividing lines defining the dimensions of chips 13 (FIG. 2) which are produced by the method explained in the following by dividing the wafer 10 into individual chips 13.

As becomes clear from the isometric illustration of a wafer segment 14, the dividing lines 11, 12 define the dimensions of the chip 13 in the wafer plane, i.e. length and width of the chip, which are identical in the case at hand, so that the chip 13 has an edge length l in the wafer plane. The height of the chip 13 is defined by the thickness h of the wafer 10.

Figure 2:
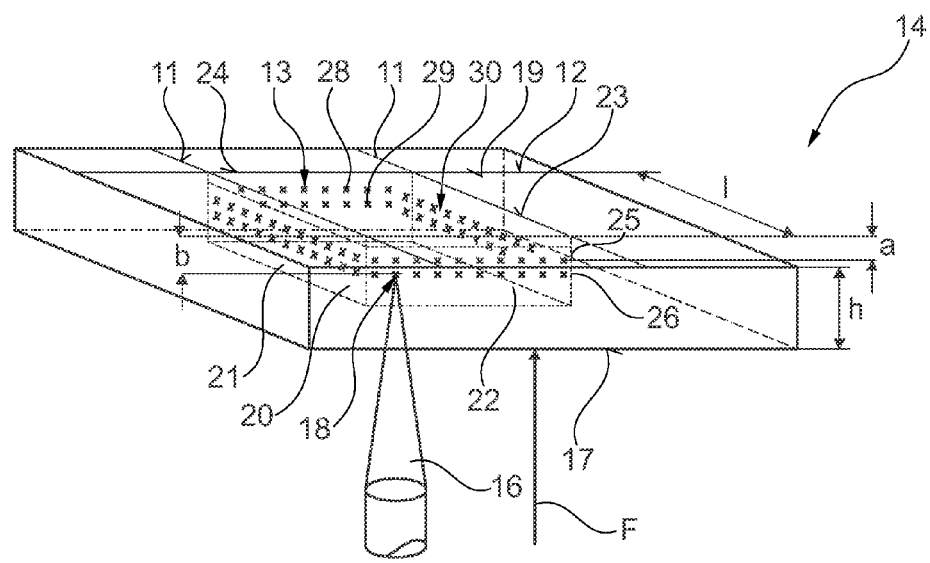
FIG. 2 shows a segment of the wafer illustrated in FIG. 1 with a chip defined in its dimensions by the dividing lines during the division of the wafer.

In the method for separating chips 13 from the wafer segment 14 of the wafer 10 illustrated in FIG. 2, laser radiation 16 is applied to the wafer 10 such that the laser radiation 16 is applied to a rear side 17 of the wafer 10 and that it is focused such that a focus 18 has a defined distance from the front side 19 of the wafer 10.

As can be taken from the illustration in FIG. 2, the dividing lines 11, 12 in a silicon body 20 of the wafer 10 define the position of dividing planes 21, 22, 23 and 24 which are arranged vertically to the front side 19 of the wafer 10 and in which the focus 18 of the laser radiation 16 is moved along defined paths 25, 26. The focus is preferably moved along a path system 30 composed of the paths 25, 26 in such a manner that in a first phase of the laser application, the focus 18 of the laser radiation 16 is initially moved along the first paths 25, which are located at a distance a from the front side 19 of the wafer 10 and run parallel to the dividing lines 12 illustrated in FIG. 1. Then, the focus 18 is moved along the paths 25 which run parallel to the dividing lines 11 (FIG. 1).

The motion of the focus 18 along the paths 25 preferably takes place such that the focus 18 is moved with constant speed along the paths 25 and a laser source (not illustrated) which emits the laser radiation 16 is operated in pulsed operation. By means of the focused laser radiation, polycrystalline enclaves are produced in the silicon body along the paths 25 by partially melting the monocrystalline silicon, said enclaves inducing compressive stresses in the silicon body because of the larger volume of the polycrystalline structure. Together with the defects 28 formed by the polycrystalline enclaves, the paths 25 form lines of increased stress running parallel to the front side of the wafer 10.

Following the production of the first paths 25, which are arranged in the dividing pattern 27 and are located at a distance a from the front side 19 of the wafer, the laser radiation 16 is focused such that the focus 18 is located at a distance b from the front side 19 of the wafer 10 and the focus 18 is then moved according to the dividing pattern 27 along the second paths 26 through the silicon body, and defects 29 are formed.

The laser application along the first paths 25 and the second paths 26 is performed with differing power densities in such a manner that the power density for producing the defects 28 on the first paths 25 is lower than the power density for producing the defects 29 on the second paths 26. As a result, the stresses induced in the silicon body 20 by the defects 29 of the second paths 26 are higher than the stresses induced by the defects 28 of the paths 25.

Figure 3:
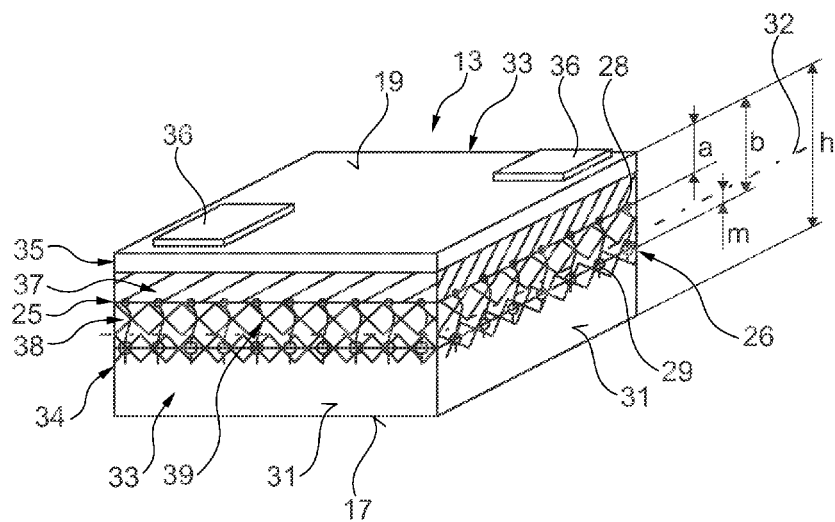
FIG. 3 shows the chip produced by division from the wafer segment illustrated in FIG. 2 in an isometric illustration.

Following the production of the path system 30 formed in correspondence to the dividing pattern 27 in the silicon body 20 of the wafer 10 with the paths 25 and 26 and with the corresponding defects 28 and 29, the wafer 10 is subjected to a force F, with the result that the wafer 10 fractures in the dividing planes 21, 22, 23, 24 defined by the path system 30 so that the dividing planes 21, 22, 23, 24 form lateral surfaces 31 of the separated chip 13 illustrated in FIG. 3.

FIG. 3 shows the chip 13 with four lateral surfaces 31, which each have defects 28 along the first path 25 and defects 29 along the second path 26. The defects 28 of the first path 25, which have been produced with less power density as compared to the defects 29 of the second path 26, are formed smaller in the embodiment example illustrated in FIG. 3. The path 25 with the defects 28 is located at a distance a from the front side 19 of the chip 13, said distance a being about 40% of the distance m between the front side 19 and the center line 32 of the lateral surfaces 31. The second path 26 with the defects 29 is located at a distance b from the front side 19 and at a distance m from the center line 32, which corresponds to about 30% of the height h of the chip 13, and is arranged below the center line 32.

As can further be taken from the schematic illustration in FIG. 3, a semiconductor body 33 of the chip 13 is substantially divided into a semiconductor base 34, which represents the essential portion of the semiconductor body 33, and a functional layer 35, which forms the front side 19 of the chip 13 and within which the circuit of the chip 13 is formed and which is provided with chip terminal faces 36.

As is indicated by the differently hatched areas of the lateral surfaces 31, the lateral surfaces 31 have different surface areas 37 and 38. The surface areas 37 and 38 substantially differ in their topography in such a manner that the surface roughness of the surface area 37 formed between the first path 25 and the functional layer 35 is lower than the roughness of a surface area 38 which is formed below the first path 25 and which in comparison to the surface area 37 visibly shows micro cracks 39, which are also called "Wallner lines" in professional terminology.

Figure 4:
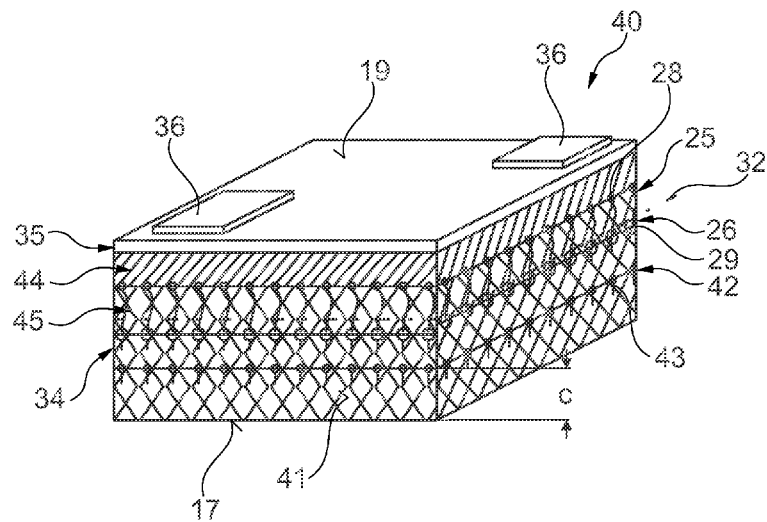
FIG. 4 shows an embodiment of a chip produced by division from a wafer as an alternative to the chip illustrated in FIG. 3.

In another embodiment, FIG. 4 shows a chip 40 which is provided with lateral surfaces 41 which, in contrast to the lateral surfaces 31 of the chip 13 illustrated in FIG. 3, have a third path 42 with defects 43 in addition to the first and second paths 25, 26, said third path 42 running between the second path 26 and the rear side 17 of the semiconductor body 33.

As can be seen from the schematic illustration of the lateral surfaces 41 in FIG. 4, a differentiation between surface areas 44, 45 is also possible in the chip 40 illustrated in FIG. 4, said surface areas 44, 45 being separated from each other by the first path 25.

In analogy to the chip 13 laid out with reference to FIG. 3, the surface area 44 formed between the functional layer 35 of the chip 40 and the first path 25 is also provided with lower roughness as compared to surface area 45 in the chip 40 illustrated in FIG. 4.

As is visible in the schematic illustration of FIG. 4, the defects 28, 29, 43 are embodied in different sizes in the illustrated embodiment example because the defects 28, 29 and 43 have been produced with different power densities, wherein the power density of the defects 28 of the first path 25 corresponds to about 70% of the power density for producing the defects 29 of the second path 26, and the power density for producing the defects 43 of the third path 42 corresponds to about 25% of the power density for producing the defects 29 of the second path 26.

The invention claimed is:

1. A method for separating chips from a monocrystalline silicon wafer, said method comprising:
    dividing the wafer along dividing lines defining dimensions of the chip,
    moving a focus of a pulsed laser radiation along the dividing lines on a first and at least a second path within the wafer body,
    wherein the first path runs between a functional layer arranged on a front side of the wafer and the second path in such a manner that polycrystalline defects for producing internal stresses in the silicon body are formed on the paths as a result of a partial melting of the monocrystalline silicon body,
    wherein the first path is introduced in the upper 15 to 25% of the chip's height, relative to an upper side, wherein the upper side is the functional layer,
    wherein the laser radiation is applied to the wafer from a rear side of the wafer, and a power density for producing a number of the defects on the first path is lower than a power density for producing a number of the defects on the second path, and/or the number of defects on the first path is smaller than the number of defects on the second path, such that a falling stress gradient is formed between internal stresses induced along the second path and the first path by the defects, and the first path forms a barrier against crack propagation beyond the first path in the direction of the functional layer of the wafer,
    subjecting the wafer to a mechanical load so as to separate the chips from the wafer by way of a material fracture in dividing planes defined by the first and second path and form the lateral surfaces of the chips following the production of a path system of first and second paths.

2. The method according to claim 1,
    wherein the power density for producing a number of the defects on the first path is lower than the power density for producing a number of the defects on the second path,
    wherein a difference between the power density for producing the defects on the first path and the power density for producing the defects on the second path is selected such that lateral surfaces of the chips exhibit a lower roughness in a surface area between the first path and the front side of the chips as compared to a surface area between the first path and the second path.

3. The method according to claim 1,
    wherein the power density for producing a number of the defects on the first path is lower than the power density for producing a number of the defects on the second path,
    wherein a difference between the number of defects on the first path and the number of defects on the second path is selected such that lateral surfaces of the chips exhibit a lower roughness in a surface area between the first path and the front side of the chips as compared to a surface area between the first path and the second path.

4. The method according to claim 1, in which formation of the defects on the first path takes place prior to the formation of the defects on the second path.

5. The method according to claim 1, in which the second path is adjacent to or in a center plane of the wafer.

6. The method according to claim 5,
    wherein a third path is between the center plane and the rear side of the wafer,
    wherein the third path is disposed in a lateral surface defined by the first and second paths.

7. The method according to claim 1,
    wherein the power density for producing a number of the defects on the first path is lower than the power density for producing a number of the defects on the second path,
    wherein the power density for producing the defects of the first path is equal or less than 90% of the power density for producing the defects of the second path.

8. The method according to claim 7, in which the power density for producing the defects of the first path is equal or less than 80% of the power density for producing the defects of the second path.

9. The method according to claim 7, in which the power density for producing the defects of the first path is equal or less than 75% of the power density for producing the defects of the second path.

10. The method according to claim 6, in which a power density for producing the defects of the third path is equal or less than 50% of the power density for producing the defects of the second path.

11. The method according to claim 6, in which a power density for producing the defects of the third path is equal or less than 50% of the power density for producing the defects of the second path.

12. The method according to claim 6, in which a power density for producing the defects of the third path is equal or less than 50% of the power density for producing the defects of the second path.

* * * * *